US011870391B2

United States Patent
Bönsch et al.

(10) Patent No.: US 11,870,391 B2
(45) Date of Patent: Jan. 9, 2024

(54) PHOTOVOLTAIC MODULE AND CONNECTION ARRANGEMENT FOR A PHOTOVOLTAIC MODULE

(71) Applicant: Weidmüller Interface GmbH & Co. KG, Detmold (DE)

(72) Inventors: Matthias Bönsch, Bielefeld (DE); Torsten Wünsche, Leopoldshöhe (DE); Niels Dallmann, Brilon (DE)

(73) Assignee: Weidmüller Interface GmbH & Co. KG

( * ) Notice: Subject to any disclaimer, the term of this patent is extended or adjusted under 35 U.S.C. 154(b) by 0 days.

(21) Appl. No.: 17/935,394

(22) Filed: Sep. 26, 2022

(65) Prior Publication Data
US 2023/0231514 A1 Jul. 20, 2023

(30) Foreign Application Priority Data
Sep. 29, 2021 (DE) ...................... 10 2021 125 242.3

(51) Int. Cl.
*H02S 40/34* (2014.01)
*H01L 31/044* (2014.01)

(52) U.S. Cl.
CPC ............ *H02S 40/34* (2014.12); *H01L 31/044* (2014.12)

(58) Field of Classification Search
CPC .............................. H02S 40/34; H01L 31/044
See application file for complete search history.

(56) References Cited

U.S. PATENT DOCUMENTS

| | | | | |
|---|---|---|---|---|
| 6,225,793 B1* | 5/2001 | Dickmann | ............ | H01L 31/044 323/230 |
| 2008/0115911 A1* | 5/2008 | Duesterhoeft | .......... | H02S 40/34 165/104.21 |
| 2010/0218802 A1* | 9/2010 | Quiter | .................. | H01R 4/4827 29/857 |
| 2015/0053251 A1 | 2/2015 | Hopf | | |
| 2015/0162870 A1 | 6/2015 | Beck et al. | | |
| 2016/0141435 A1 | 5/2016 | Sridhara et al. | | |

(Continued)

FOREIGN PATENT DOCUMENTS

| | | |
|---|---|---|
| CN | 202996867 U | 6/2013 |
| CN | 107612493 A | 1/2018 |
| DE | 10331780 A1 | 3/2005 |

(Continued)

OTHER PUBLICATIONS

Byunghak Kim, KR20110009367 (U), English Machine Translation. (Year: 2011).*

(Continued)

*Primary Examiner* — Tae-Sik Kang
(74) *Attorney, Agent, or Firm* — LAUBSCHER & LAUBSCHER, P.C

(57) ABSTRACT

A connection assembly for a photovoltaic module includes at least one cell assembly which is externally contactable to at least two contacts. The connection assembly includes at least one bypass diode, which is arranged externally of the at least one cell assembly and connected in parallel to the at least one cell assembly. The connection assembly is characterized in that the connection assembly has at least one plug receptacle into which the bypass diode can be plugged in with plug contacts. A photovoltaic module with such a connection assembly is also provided.

9 Claims, 6 Drawing Sheets

(56) References Cited

U.S. PATENT DOCUMENTS

2016/0359450 A1* 12/2016 Galitev .................. H02S 40/32

FOREIGN PATENT DOCUMENTS

| DE | 102010030478 A1 | 12/2011 | | |
|---|---|---|---|---|
| DE | 102010056591 A1 | 7/2012 | | |
| DE | 102011052928 A1 | 8/2012 | | |
| DE | 202012103480 U1 | 8/2013 | | |
| DE | 102015111768 A1 | 1/2017 | | |
| DE | 102015218526 A1 | 3/2017 | | |
| KR | 20110009367 U | * | 10/2011 | |
| WO | WO-2018043875 A1 | * | 3/2018 | ............. G01R 31/40 |

OTHER PUBLICATIONS

Ko et al., WO2018043875 (A1), English Machine Translation. (Year: 2018).*

* cited by examiner

PHOTOVOLTAIC MODULE AND CONNECTION ARRANGEMENT FOR A PHOTOVOLTAIC MODULE

This application claims priority of DE 10 2021 125 242.3 filed Sep. 29, 2021. The entire content of this application is incorporated herein by reference.

BACKGROUND OF THE INVENTION

The invention relates to a connection assembly for a photovoltaic module (PV module) which has at least one cell assembly which is externally contactable to at least two contacts. The connection assembly includes at least one bypass diode which is arranged externally of the at least one cell assembly and connected in parallel to the at least one cell assembly. The invention further relates to a photovoltaic module with such a connection assembly.

PV modules, e.g. for mounting on a house roof or in ground-mounted facilities, generally have a number of photovoltaic cells (PV cells) which, connected in series and/or in parallel, form at least one cell assembly which is contactable externally via power cables. PV modules frequently have several such cell assemblies which are interconnected in series inside the PV module. In this case, each of the cell assemblies is usually guided out of the module by its end connections, in order to connect one so-called "bypass diode" in parallel to each cell assembly. The bypass diodes conduct current past shadowed or faulty cell assemblies. Without the bypass diodes, shadowing or a fault of one of the cell assemblies of the module would reduce the flow of current through the entire module, even if the other cell assemblies of the module or even other additional modules connected in series with the module are not in shadow or faulty.

From the prior art, PV modules are known in which connections of the present cell assemblies (usually of three cell assemblies) are contactable adjacent to one another at a rear side of the PV module in a common connection region. The contacts, for example, may be non-isolated contact strips on the rear side of the PV modules which is otherwise covered by an isolating layer. A connection box is placed—glued on, for example—over the contact region, inside which connection box the bypass diodes are arranged and contact the contact surfaces of the PV module. In addition, two power cables lead to the connection box which are connected to the outer contacts of the serially interconnected cell assemblies and via which the PV module is externally connected.

A PV module with such a connection assembly is described in document US 2016/0141435 A1, for example. In a further embodiment, the document describes a PV module in which contact surfaces of various cell assemblies are not positioned in a common connection region on the rear side of the PV module, but rather at several different positions. In this case, each of the connection regions is covered by a socket which receives a bypass diode. At least two of the sockets function, as described previously, as a connection box, by a power cable leading to these sockets for the external connection of the PV module and being connected to one of the cell assemblies inside the socket. A further embodiment describes how the bypass diodes can also be integrated into the PV module, specifically in the layer stack of the PV module.

Shadowing of individual cell assemblies while the sun is shining strongly onto neighboring cell assemblies can lead to unfavorable operating situations for the associated bypass diodes, as a result of which high currents and high temperatures arise. Such operating situations, and also ageing processes, can lead to a fault in a bypass diode. If a bypass diode is not integrated into the layer stack of a PV module, it is true that, in principle, it could be exchanged, but users and in some cases installers of PV modules do not normally have the knowledge and tools required to do this.

SUMMARY OF THE INVENTION

A problem to be solved is to create a connection assembly for a PV module and a PV module with a connection assembly, with which problems due to faulty bypass diodes can also be remedied in a simple manner by non-specialist persons.

A connection assembly according to the invention of the type mentioned at the outset is characterized by at least one plug receptacle into which the bypass diode is plugged with plug contacts.

The plug receptacle, together with the bypass diode which can be plugged in, affords simple exchange of the bypass diode when it has become non-functional due to a thermal and/or electrical overload situation, for example. Due to the simple plugging process, the exchange can also be performed by untrained personnel. In addition, it is possible to remove a bypass diode and easily checking that it is functional, which, in the case of a bypass diode installed in the connection assembly, is possible only with more elaborate measuring methods. Furthermore, the bypass diode's ability to be plugged in enables flexible equipping or retrofitting of the connection assembly with bypass diodes of differing quality levels. For example, bypass diodes made of silicon which are initially provided by the manufacturer can be exchanged for actively connected bypass diodes based on MOSFET transistors, in order to minimize losses in the event of shadow.

In an advantageous configuration, the connection assembly has at least one connection box. A power cable for the photovoltaic module and/or a connection cable which leads to a further connection box leads to the connection box. The connection box can have a contact element which can be connected to contacts of the photovoltaic module The contacts of the PV module may be exposed contact strips on the rear side of the PV module, for example. In this case, the contact element is soldered or welded, for example, onto the contact strips, e.g. by spot welding. A spring contact, in particular a double-spring contact, can also be employed. The contacts of the PV module may also be protruding connection contacts which are already applied onto exposed contact strips. In this case, the contact element of the connection box can be a tulip contact or another plug contact, for example. A protruding connection contact can also be contacted via a spring contact or a welded or soldered contact.

In a further preferred configuration, the connection box can have an isolation-penetrating contact for connection to the power cable and/or the connection cable. A connection to the cables can thus be produced in a simple and space-saving manner. In alternative configurations, a connection can also be produced by a crimping, soldering, welding or caulking process to a cable end which is stripped in each case.

In one configuration, the connection box can have at least one plug receptacle into which at least one bypass diode is plugged. If several connection boxes are present, each can receive one plug receptacle, for example. Several plug receptacles for several bypass diodes can also be provided in one connection box, if required also for all bypass diodes which are present, in particular if only one connection box is present on the PV module. Preferably, at least part of the surface of the bypass diode is situated outside the connection box. This makes the bypass diode easily accessible and it can be exchanged without the connection box having to be opened. In addition the bypass diode stored at least partially outside has the advantage that a direct introduction of heat into the PV module is avoided or at least reduced. As a result, a deterioration of the performance of the PV module as a result of a thermal input of the bypass diode is prevented or lowered.

In one configuration, a plug holder, which is looped in or arranged within at least one of the connection cables can be provided with the plug holder having at least one plug receptacle into which the bypass diode is plugged. This configuration is suitable for making bypass diodes, which are looped in a connection cable, pluggable and thus exchangeable.

In a further configuration of the connection assembly, the bypass diode is received in a housing from which the plug contacts protrude. The housing is preferably formed from an isolating material and serves as a gripping region to safely grip the bypass diode and plug it into the plug receptacle or remove it. A mechanical coding can also be performed via the housing, so that the bypass diode is able to be inserted only with correct polarity. Finally, the housing enables good release of heat, which arises as a heat loss in the bypass diode, to the surroundings because the housing has a larger surface than the bypass diode itself. This applies in particular if the bypass diode is surrounded in the housing by a grouting compound which conducts heat well, e.g. a plastic compound.

In a further configuration of the connection assembly, a light-emittting diode is connected in parallel to the at least one bypass diode. In the event of a faulty bypass diode, a drop in voltage over the bypass diode leads to the light-emitting diode lighting up, as a result of which the defective state of the bypass diode is indicated.

The light-emitting diode can be arranged together with the bypass diode, e.g. in a common housing, which can be clear or partially clear, so that a defect indicated by the light-emitting diode can be easily recognized from the outside. The bypass diode can alternatively also be overmolded with a clear substance. Alternatively, it is also possible to arrange the light-emitting diode in the region of the plug receptacle.

In a PV module according to the invention, bypass diodes can be easily exchanged due to the use of such a connection assemby to provide the advantages described in connection with the connection assembly.

BRIEF DESCRIPTION OF THE DRAWING

The invention will be explained in greater detail below using an embodiment with the aid of the accompanying figures, in which:

FIG. 1b is a detailed perspective view of part of a connection assembly of the PV module from FIG. 1a;

FIG. 1c is a detailed perspective view of a diode assembly of the PV module from FIG. 1a;

DETAILED DESCRIPTION

Figure 1A:
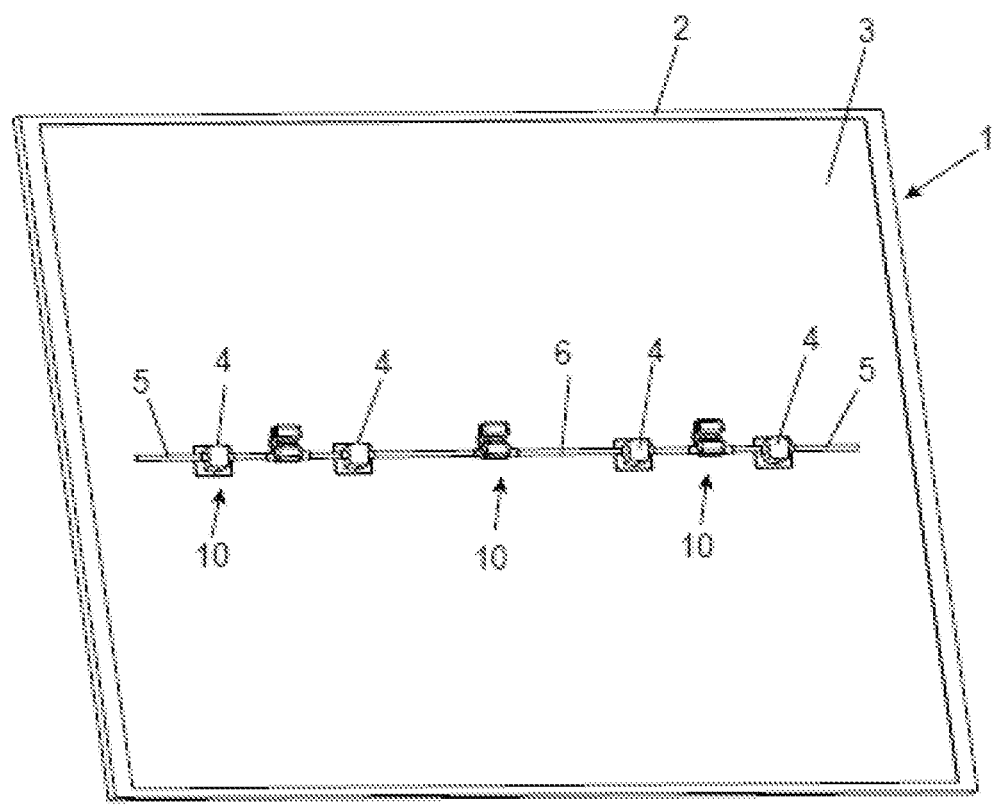
FIG. 1a is a perspective view of a PV module with a view onto its rear side.

FIG. 1a shows a PV module 1 in an isometric depiction. The PV module 1 has a frame 2 and the actual module structure, which in the context of this application is also referred to as the layered design or layer stack. Only a rear side 3 of this module structure can be seen in FIG. 1a.

In the PV module 1, the module structure includes one or more cell assemblies—specifically three in this example—which each have a number of PV cells which cannot be seen individually and which are connected to one another on the rear side 3 at their electrodes via e.g. conductor tracks. The rear side 3 is covered by an isolating layer which is removed at selected locations in order to expose the electrodes or the conductor tracks which connect them and to enable contacting. Alternatively, there can also be connecting lugs or connecting contacts present which are connected to the electrodes or the conductor tracks and which protrude from the isolating layer.

In the embodiment shown in FIG. 1a, the PV module 1 is contacted at four locations. One connection box 4 in each case is installed, preferably glued on, via the contact locations. Two adjacently located contact locations or connection boxes 4 are allocated to a cell assembly of the PV module. By way of example, a first cell assembly can be contacted via the two left-most of the connection boxes 4, a second cell assembly can be contacted via the two middle connection boxes 4 and a third cell assembly can be contacted via the two right-most connection boxes 4. It should be noted that the number of cell assemblies connected to one another in series in this embodiment, which is three here, is purely by way of example. The connection assembly presented can be employed for any number of cell assemblies connected to one another in series. The individual cell assemblies themselves generally have a number of cells which in turn are interconnected in series and/or in parallel.

From each of the outer two of the connection boxes 4, a power cable 5 extends outwardly. This power cable 5 is depicted in a shortened manner in the figures. In one embodiment, this power cable 5 is configured to be longer and has at its end in each case a plug connector with which a connection can be made to an adjacent module or a module connection box or the like.

Between two of the connection boxes 4 in each case there is arranged a connection cable 6 into which a diode assembly 10 is looped or arranged. The diode assembly 10 is shown merely schematically in FIG. 1a. It includes a plugged bypass diode, not shown, which contacts the two cable sections of the connection cable 6 by its anode or cathode respectively. In the present case, three bypass diodes are each connected antiparallel to each of the three cell assemblies of the PV module 1.

The connection assembly can preferably be pre-fabricated and pre-installed, so that it need only be fitted onto connection contacts of the PV module 1 during the final mounting of the PV module 1. An adhesive sealing agent with which the connection boxes 4 are glued onto the rear side 3 of the PV module 1 in a sealing manner is preferably used.

Isolation-penetrating contacts, for example, can be used to connect the power cable 5 or connection cable 6 inside the connection boxes 4. In addition, the power cable 5 can be configured integrally with the corresponding section of the connection cable 6. The power cable 5 and this section of the connection cable 6 are a continuous piece of cable in this case. The same applies to the two sections of the connection cable 6 in the case of the two middle connection boxes 4 depicted in FIG. 1*a*.

Figure 1B:
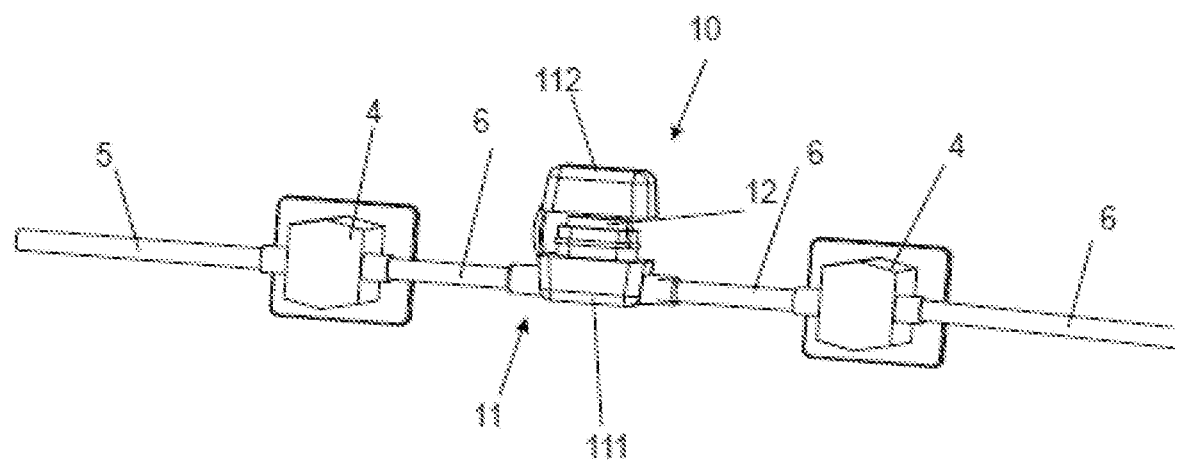
Figure 1C:
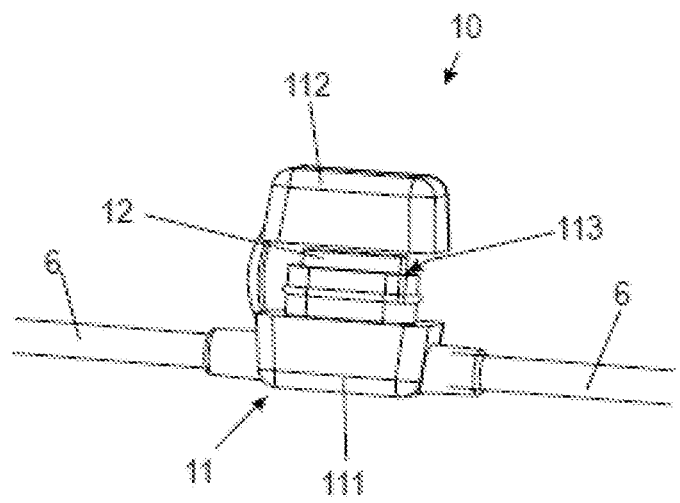

FIG. 1*b* shows part of the connection assembly of the PV module 1 from FIG. 1*a* in greater detail, in an isometric view. The diode assembly 10 includes a plug holder 11, into which the bypass diode can be plugged. The plug holder 11 is represented in an enlarged fashion in FIG. 1*c*.

The plug holder 11 includes a plug-in base 111, in which the bypass diode can be plugged into a plug receptacle 113. A sealing cap 112, which can be fitted onto the plug holder 11 with the plugged-in bypass diode and which seals the plug receptacle 113, is undetachably connected to the plug-in base 111 via a flexible bar. Not visible in FIGS. 1*b* and 1*c*, contacts which are coupled to the connection cables 6 and contact the plugged-in bypass diode are arranged in the plug-in base 111. The plug receptacle 113 and the plugged-in bypass diode can be formed such that the bypass diode can be plugged in only in one possible orientation, in order to ensure the correct polarity of the plugged-in bypass diode.

The plug holder 11 or its plug receptacle 123, together with the bypass diode which can be plugged in, offers one simple possibility for exchanging the bypass diode when it has become non-functional due to a thermal and/or electrical overload situation, for example. Due to the simple plugging process, the exchange can also be performed by untrained personnel. In addition, it is possible to remove a bypass diode and easily check that it is functional, which, in the case of a bypass diode installed in the connection assembly, is possible only with more elaborate measuring methods. Furthermore, the bypass diode's ability to be plugged in enables flexible equipping or retrofitting of the connection assembly with bypass diodes of differing quality levels. For example, bypass diodes made of silicon which are initially provided by the manufacturer can be exchanged for actively connected bypass diodes based on MOSFET transistors, in order to minimize losses in the event of shadow.

Figure 2:
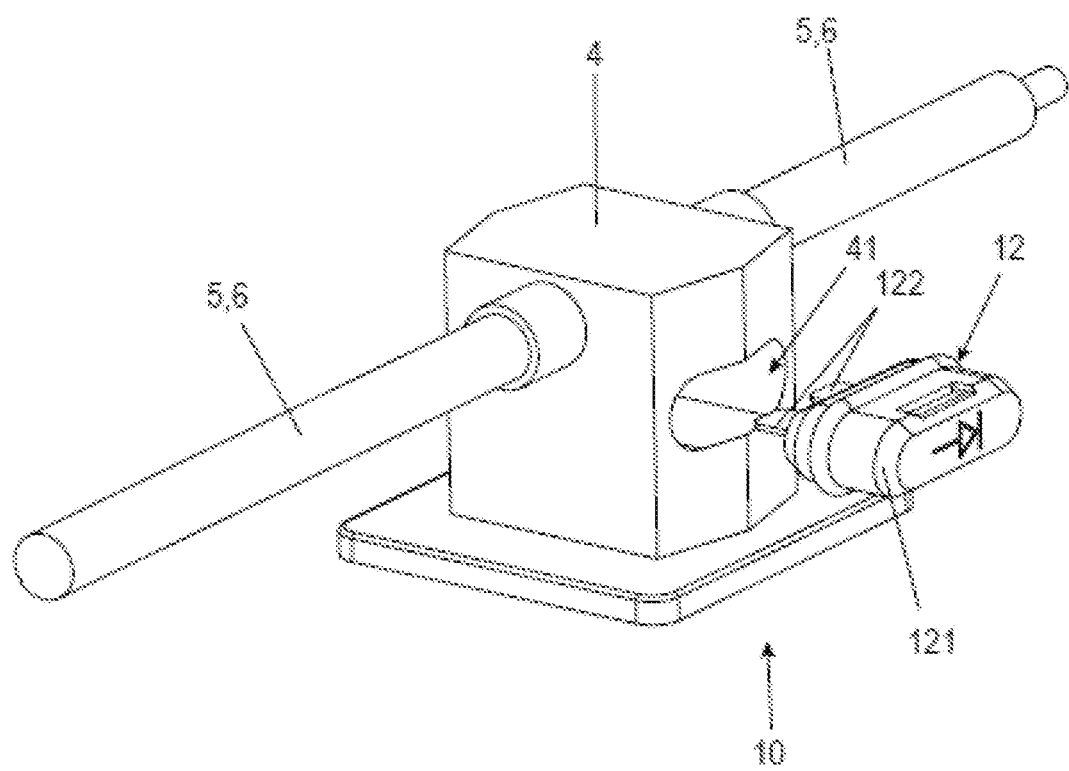
FIG. 2 is a detailed perspective view of part of a connection assembly of the further embodiment of a PV module.

FIG. 2 shows part of a connection assembly for a PV module in a further embodiment. The connection assembly in turn has a connection box 4 which is installed on the rear side of the PV module. Two cables, which can be power cables 5 and/or connection cables 6, lead to the connection box 4.

In this embodiment, a plug receptacle 41 is configured, as part of a diode assembly 10, in the connection box 4. The plug receptacle 41 corresponds to the plug receptacle 113 of the plug holder 11, by a diode unit 12 being able to be plugged in with a bypass diode. In the example from FIG. 2, the diode unit 12 is depicted separately from the connection box 4, i.e. in a state shortly before the plugging-in into the plug receptacle 41, for example.

The connection box 4 can be positioned over a contact of the PV module so that inside the connection box 4, the contact of the PV module is connected to the bypass diode and also to the power cables 5 or connection cables 6. Alternatively, the shown connection box 4 can only produce a connection between the bypass diode and the shown cables (which in this case are then exclusively connection cables 6). The connection box 4 then, in principle, corresponds to the plug holder 11 of the previous embodiment, with the difference that the connection box 4 is installed on the rear side of the PV module and is not borne by the connection cables 6.

In the diode unit 12, the bypass diode is arranged in a housing 121 and is connected inside the housing 121 with plug contacts 122 which protrude out of the housing 121. The diode unit 12 shown in FIG. 2 is also depicted in greater detail separately in FIG. 3*a*. FIG. 3*b* likewise shows a diode unit 12 with a housing 121 and plug contacts 122, which differs from the example shown in FIGS. 2 and 3*a* by the shape of its housing 121.

The housing 121, which is made of an isolating material, serves as a gripping region at which the diode unit 12 can be safely gripped and inserted into the plug receptacle 41 or 113 or pulled out of it. Due to the height of the housing 121, mating contacts which are configured in the connection box 4 or plug-in base 111 of the plug holder 11, and with which the plug contacts 122 come into contact, are recessed so far in a shaft of the plug receptacle 41, 113 that touching is precluded.

Figure 3A:
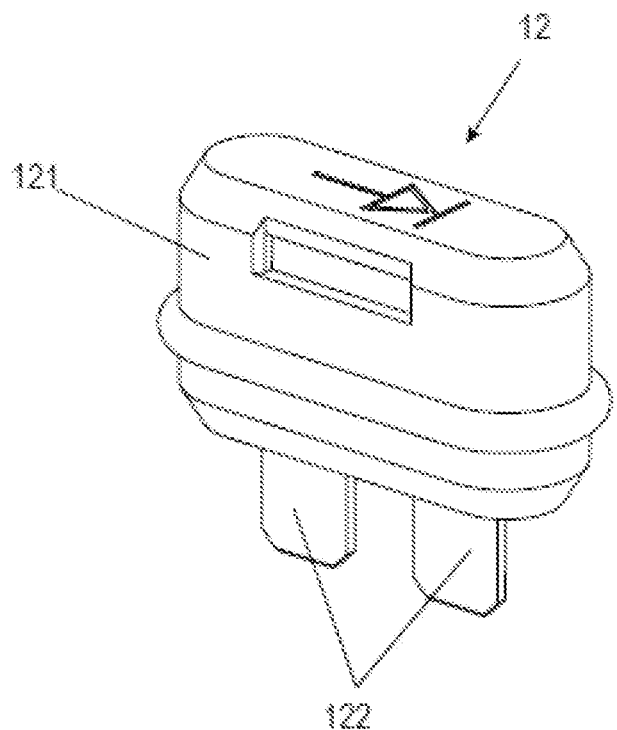
FIGS. 3a and 3b are perspective views of diode units, respectively, for use with a PV module.
Figure 3B:
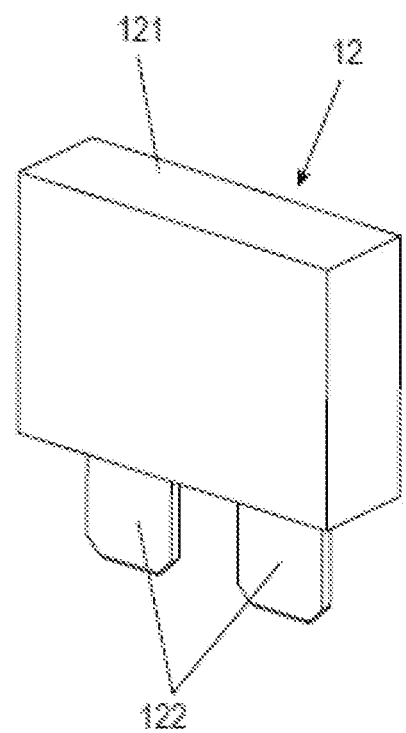

In the housing 121 shown in FIGS. 2 and 3*a*, recesses which enable the diode unit 12 to be pulled out of the plug receptacle 41 or 113 are introduced laterally. If required, a pliers-type or forceps-type auxiliary tool can be employed for removal. In the housing 121 lower region which points towards the plug contacts 122, there is configured a bead which serves to seal the housing 121 in a shaft of the plug receptacle 41, 113.

Figure 4A:
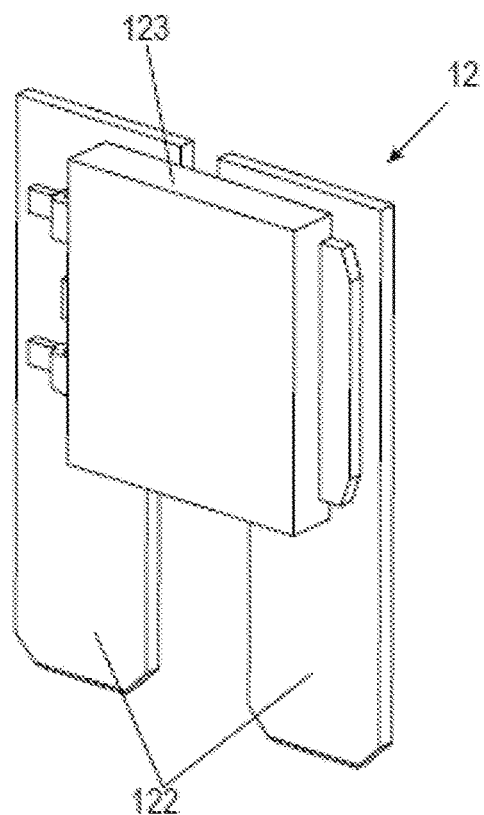
FIGS. 4a and 4b are perspective views of diode units, respectively, without a housing.
Figure 4B:
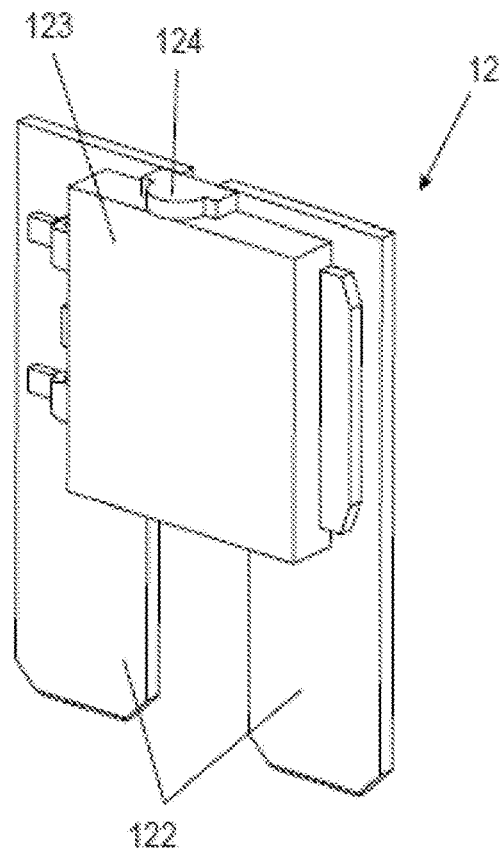

A possible inner design of the diode units 12 from FIGS. 3*a* and 3*b* is shown in FIGS. 4*a* and 4*b*. The diode units 12 are represented without the housing 121 in FIGS. 4*a* and 4*b*.

The diode unit 12 in each case has one bypass diode 123, which is soldered onto the plug contacts 122 with connection elements. By way of example, the bypass diodes 123 are surface-mounted components. In alternative configurations, leaded bypass diodes whose connection wires are connected to the plug contacts 122, may be used instead.

The unit made up of the bypass diode 123 and plug contacts 122 is preferably inserted into the housing 121 and grouted with grouting compound. Thus a good transfer of heat from the bypass diode 123 onto the housing 121 is achieved, with the heat being able to be given off easily to the surroundings from this housing due to the large surface of the housing 121 compared to the surface of the bypass diode 123 itself. In one configuration of the diode unit 12, the grouting compound forms the housing 121.

In contrast to the example in FIG. 4*a*, the diode unit 12 of the example in FIG. 4*b* additionally has a light-emitting diode (LED) 124, which is connected in parallel to the bypass diode 123 and is likewise connected to the plug contacts 122. The LED 124 is preferably internally equipped with a series resistor or a series resistor is connected upstream, such that a current flowing through the LED 124 is limited. With a functional bypass diode 123, there is a smaller drop in voltage at the bypass diode 123 when a current flows through the diode unit 12 than is required to light up the LED 124. In contrast, if the bypass diode 123 is faulty such that it also does not take up any flow of current in the flow direction, the drop in voltage at the plug contacts 122 is so great that the LED 124 lights up and thus indicates the defective state of the bypass diode 123. In order to be able to notice the LED 124 from outside, the housing 121 is configured to be transparent at least in this area or is equipped with a transparent viewing window. If a grouting compound is used, this is likewise selected to be transparent or does not cover the LED 124.

In alternative configurations of the connection assembly, such a light-emitting diode is not positioned in the diode unit 12, but rather inside the plug holder 11 or the connection box 4 into which the diode unit 12 is plugged.

Figure 5A:
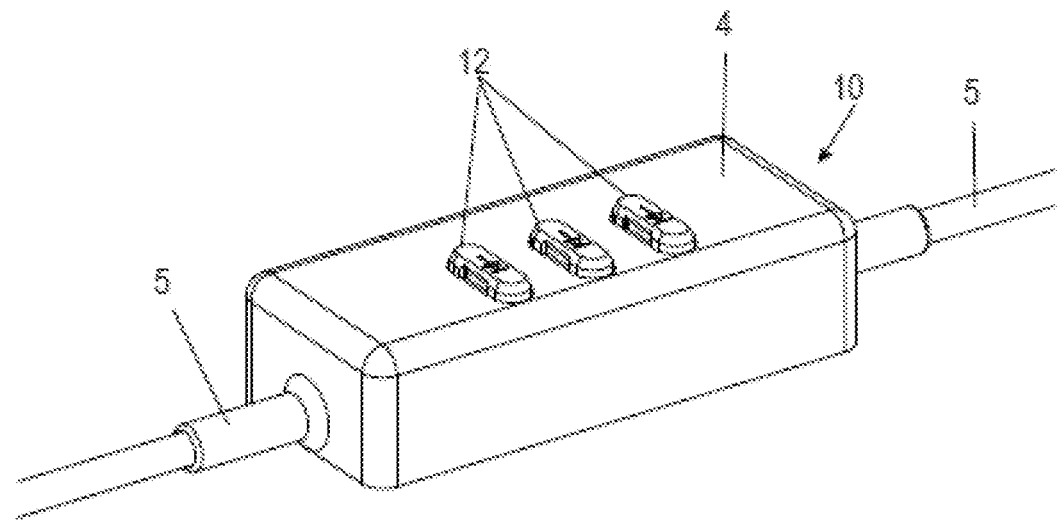
FIG. 5a is a perspective view of part of a connection assembly of the further embodiment of a PV module with inserted diode units.
Figure 5B:
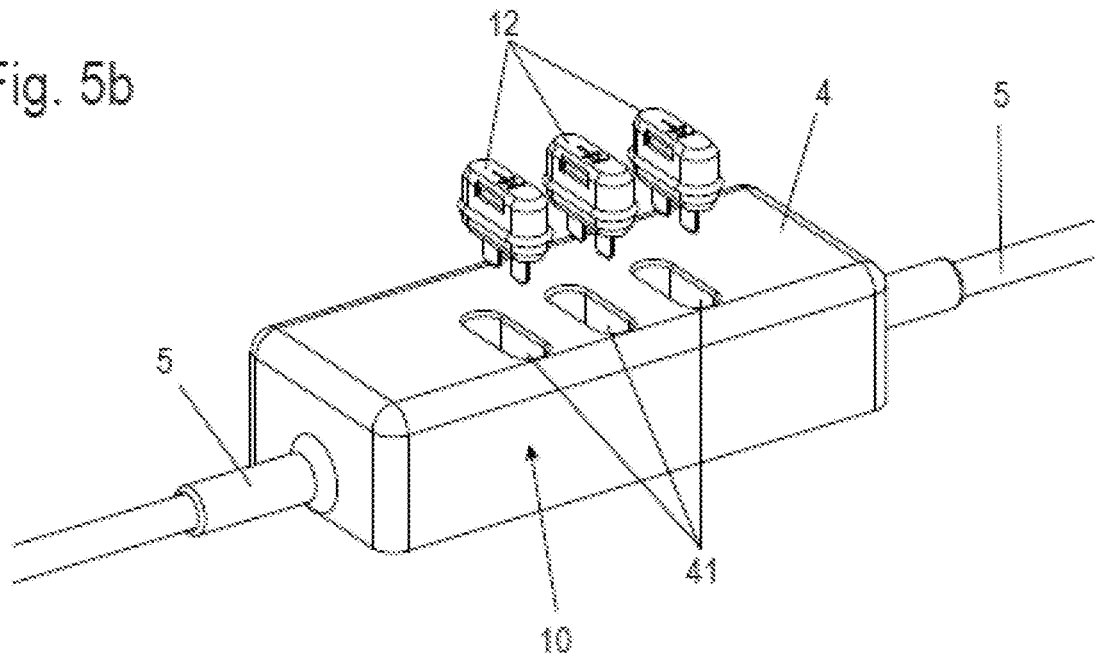
FIG. 5b shows the connection assembly FIG. 5a with diode units removed.

In a further embodiment, part of a connection assembly of a PV module is depicted in FIGS. 5a and 5b. In this embodiment, an individual connection box 4 is present on the rear side of the PV module, out of which there extend two power cables 5 for the external connection of the PV module.

The use of a single connection box 4 is employed with PV modules in which all contacts of the various cell assemblies of the PV module are guided out of the PV module, adjacently in one region. The shown connection box 4 covers this region. In the depicted example, three cell assemblies are in turn separately accessible by their end connections, in order to interconnect three bypass diodes parallel to these cell assemblies.

In a different manner than known from the prior art, in the depicted embodiment the bypass diodes are in turn arranged in pluggable diode units 12, which can be plugged into correspondingly three plug receptacles 41 configured in the connection box 4. FIG. 5a shows the diode units 12 plugged into the plug receptacles 41, and FIG. 5b shows the diode units 12 shortly before or after plugging-in.

In an alternative configuration, it is also conceivable to employ a comparable connection box into which it is possible to plug bypass diodes which are connected inside the connection box to the cell assembly of the PV module, but with power cables leading to one or more further connection box(es) which are separate therefrom and in which they are connected to the PV module.

What is claimed is:

1. A connection assembly for a photovoltaic module, comprising
   at least one cell assembly including at least one external bypass diode which is connected in parallel with said at least one cell assembly, said at least one cell assembly being contacted with at least two external contacts;
   at least one connection box;
   at least one power cable connected with the photovoltaic module and at least one connection cable connected between said at least one cell assembly and said at least one connection box; and
   a plug holder looped in at least one of said connection cables, said plug holder containing at least one plug receptacle including plug contacts for a plug-in connection with which said bypass diode can be plugged into said plug contacts.

2. The connection assembly as defined in claim 1, wherein said at least one connection box includes a contact element connected with contacts of the photovoltaic module.

3. The connection assembly as defined in claim 1, wherein said connection box includes an isolation-penetrating contact for connection with at least one of said power cable and said at least one connection cable.

4. The connection assembly as defined in claim 1, wherein said at least one connection box contains at least one plug receptacle into which a further bypass diode is plugged.

5. The connection assembly as defined in claim 1, wherein said at least one bypass diode is received in a housing from which said plug contacts protrude.

6. The connection assembly as defined in claim 5, wherein said at least one bypass diode in said housing is surrounded by a grouting compound.

7. The connection assembly as defined in claim 1, and further comprising a light-emitting diode connected in parallel with said at least one bypass diode.

8. The connection assembly as defined in claim 7, wherein said light-b emitting diode is arranged in a housing.

9. The photovoltaic module comprising the at least one cell assembly as defined in claim 1.

\* \* \* \* \*